(12) United States Patent
Benham et al.

(10) Patent No.: US 7,202,756 B2
(45) Date of Patent: Apr. 10, 2007

(54) ELECTROMAGNETIC COUPLER WITH DIRECT CURRENT SIGNAL DETECTION

(75) Inventors: John Benham, Hopkinton, MA (US); John Critchlow, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 36 days.

(21) Appl. No.: 11/165,982

(22) Filed: Jun. 24, 2005

(65) Prior Publication Data

US 2006/0290440 A1    Dec. 28, 2006

(51) Int. Cl.
*H01P 5/02* (2006.01)
(52) U.S. Cl. .................................... 333/24 R
(58) Field of Classification Search ............... 333/24 R, 333/109, 116
See application file for complete search history.

(56) References Cited

U.S. PATENT DOCUMENTS 6,400,240 B2 * 6/2002 Nishida et al. ............. 333/245
6,496,886 B1 * 12/2002 Osaka et al. ................ 710/100
6,498,305 B1 * 12/2002 Marketkar et al. .......... 174/250
2001/0053187 A1 * 12/2001 Simon et al. ............... 375/257

OTHER PUBLICATIONS

Benham, John R. et al., "An Alignment Insensitive Separable Electromagnetic Coupler for High-Speed Digital Multidrop Bus Applications", IEEE Transactions on Microwave Theory and Techniques, vol. 51, No. 12, Dec. 2003, pp. 2597-2603.

* cited by examiner

*Primary Examiner*—Benny T. Lee
(74) *Attorney, Agent, or Firm*—Buckley, Maschoff & Talwalkar LLC (57) ABSTRACT

According to some embodiments, a signal line associated with a printed circuit board is provided. In addition, a conductive trace is electrically connected to a portion of the signal line. At least a portion of the conductive trace may be offset from the signal line, and a dielectric layer may be provided between the signal line and the conductive trace to enhance electromagnetic coupling between them. As a result a hybrid resistance and electromagnetic coupling probe may be provided.

10 Claims, 12 Drawing Sheets

ELECTROMAGNETIC COUPLER WITH DIRECT CURRENT SIGNAL DETECTION

BACKGROUND

A printed circuit board may have signal lines that are used to transmit data between devices. For example, a processor might transmit data to a memory unit or an Input Output (IO) device through a signal line in a motherboard. Moreover, system designers and/or testers may be interested in measuring electrical signals associated with these signal lines. For example, a system tester might want to read data as it is being transmitted to help him or her debug a problem with a particular system design.

In some cases, the information transmitted through a signal line includes both a wideband high frequency data component and embedded low frequency data. For example, a signal line might be used to transmit a clock-forwarded binary data signal at a 5 Gigabits per second (Gb/s) along with an embedded 50 nanosecond (ns) or greater duration static supervisory state. System designers and/or testers may be interested in measuring both of these components.

SUMMARY OF THE INVENTION

According to some embodiments, an apparatus may be provided including a signal line associated with a printed circuit board. A conductive trace may be electrically connected to a portion of the signal line, and at least a portion of the conductive trace may be offset from the signal line.

DETAILED DESCRIPTION OF PREFERRED EMBODIMENTS

Figure 1:
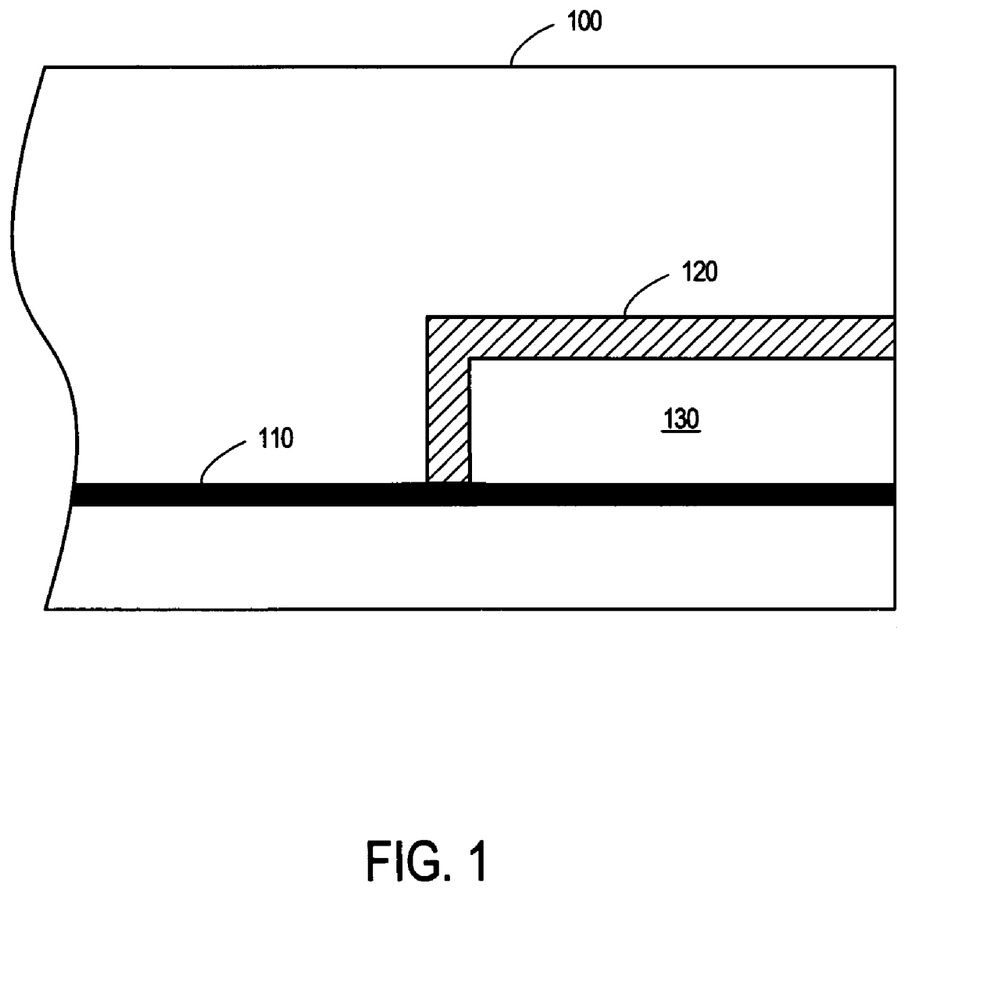
FIG. 1 is a side view of a printed circuit board according to some embodiments.

FIG. 1 is a side view of a printed circuit board 100 according to some embodiments. The printed circuit board 100 may, for example, be associated with one or more processors, memory units, and/or IO devices. According to some embodiments, the printed circuit board 100 is a motherboard formed of Flame Retardant (FR) material, such as FR4 laminate made from woven glass fiber material impregnated with epoxy resin.

The printed circuit board 100 includes a signal line 110 that may be used to transmit data between devices. The signal line 110 might comprise, for example, a copper main bus data line used to transmit data between a processor, a memory unit, and/or an IO device. Although a single signal line 110 is illustrated in FIG. 1, note that a printed circuit board 100 might include many signal lines.

System designers and/or testers may be interested in measuring electrical signals associated with the signal line 110. For example, a system tester might want to read data as it is being transmitted to help him or her debug a problem with a particular system design. To facilitate the reading of data on the signal line 110, a conductive trace 120 may be electrically connected to a portion of the signal line 110. Moreover, according to some embodiments, at least a portion of the conductive trace 120 may be offset from the signal line 110. For example, a portion of the conductive trace 120 may run substantially parallel to the signal line 110 as illustrated in FIG. 1.

The conductive trace 120 might comprise, for example, a relatively high resistance conductive material. According to some embodiments, the conductive trace 120 is a relatively thin film resistive element, such as one formed of Ohmega-ply® available from Ohmega Corp® of Culver City, Calif. Note that the conductive trace 120 might have a relatively high resistivity, such as approximately 50 or 100 ohms/square.

Because the conductive trace 120 is resistively coupled to the signal line 110, it may be used as a resistive probe element to measure a Direct Current (DC) coupling response (e.g., associated with a low frequency signal component). Moreover, because the conductive trace 120 may have been deliberately designed and oriented to be electromagnetically coupled to signal line 110 (e.g., where it runs parallel to the signal line 110), it may also be used to measure an Alternating Current (AC) coupling response (e.g., associated with a high frequency signal component). In this way, an electromagnetic coupler with DC signal detection may be provided to facilitate probing of the logical state of a relatively high speed data signal. That is, the design may provide a Hybrid Resistive Electromagnetic (HREM) probe.

To enhance the electromagnetic coupling between the signal line 110 and the conductive trace 120, a dielectric layer 130 may be provided between them according to some embodiments. The dielectric layer 130 might comprise, for example, an insulating material with a relatively high dielectric constant. Note that dielectric constant of the dielectric layer 130 may be substantially different than that of the printed circuit board 100. One example of a material that may be used for the dielectric layer 130 is NanoEC® 1015 available from the TPL company of Albuquerque, N. Mex. According to some embodiments, a material with a relatively high magnetic permeability may be provided between the signal line 110 and the conductive trace 120 (e.g., a ferrite).

Figure 2:
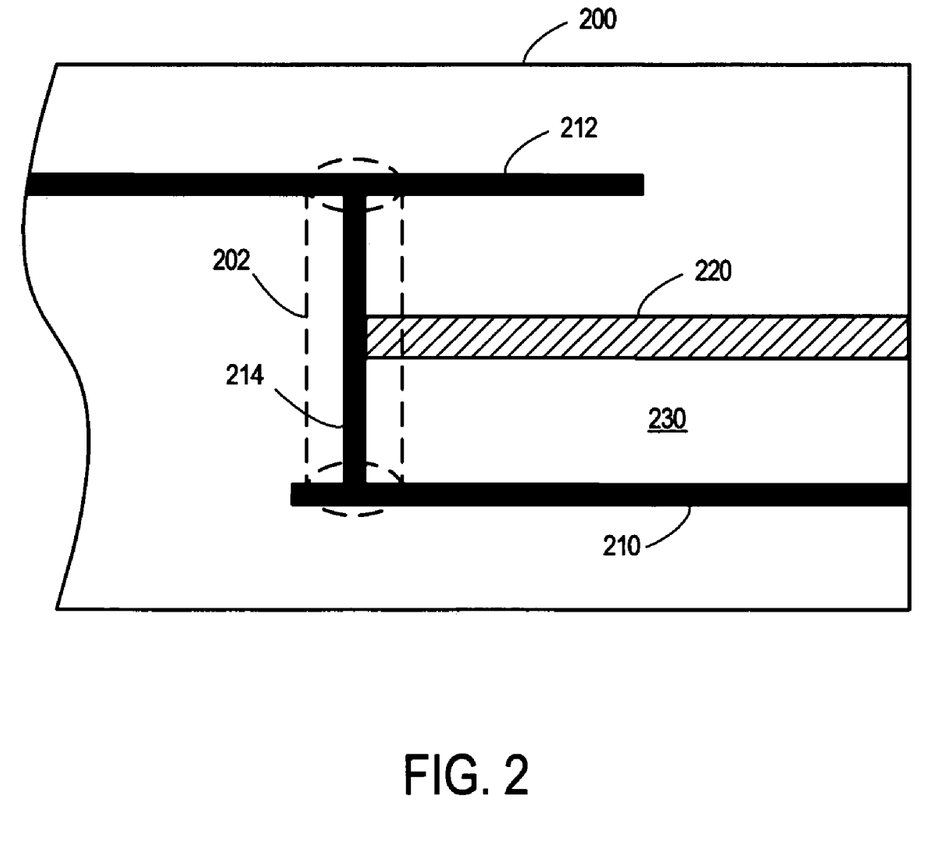
FIG. 2 is a side view of a printed circuit board wherein signal lines are present in multiple layers according to some embodiments.

FIG. 2 is a side view of a printed circuit board 200 wherein signal lines 210, 212 are present in multiple layers or planes according to some embodiments. The signal lines 210, 212 might be electrically connected, for example, through a via 202 of the printed circuit board 200. For example, the via 202 may be through hole coated with a conductive plating 214. According to some embodiments, a conductive trace 220 is electrically connected to the first signal line 210 at the via 202 (e.g., by being connected to the plating 214). As before, the conductive trace 220 may be offset from the signal line 210 and/or a dielectric layer 230 may be provided between them to provide a HREM probe.

Figure 3:
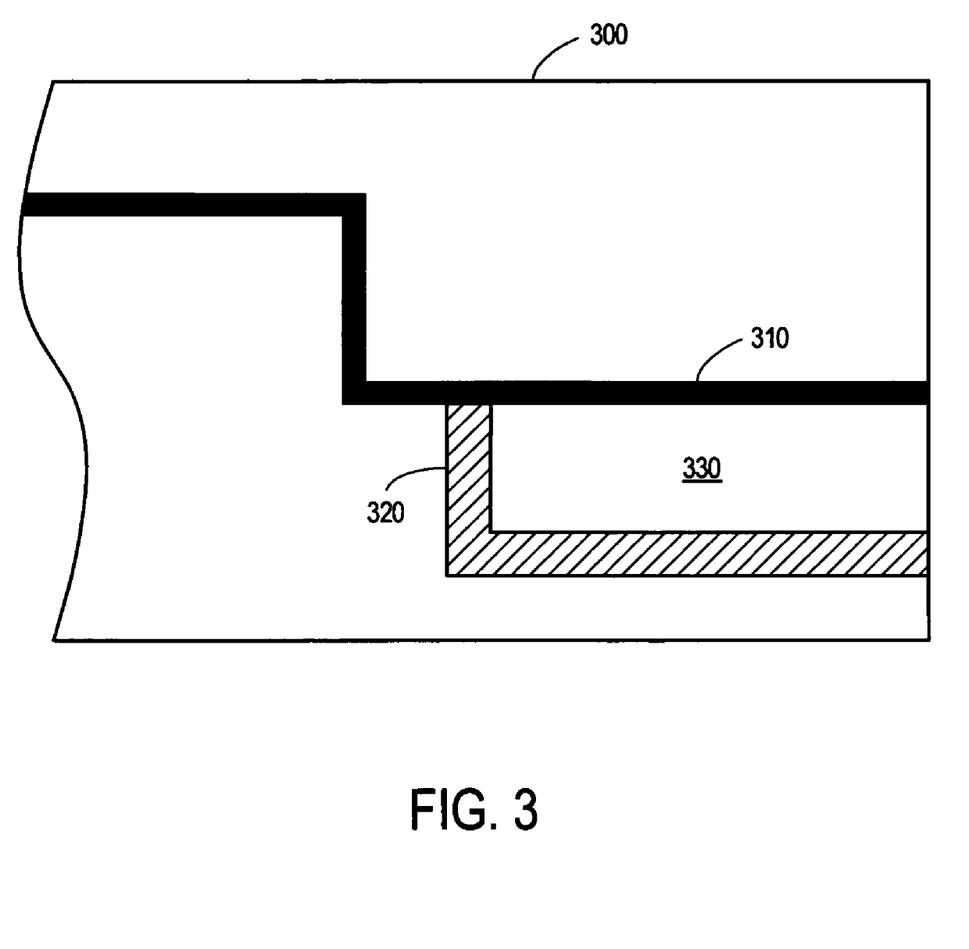
FIG. 3 is a side view of a printed circuit board wherein a conductive trace is located under a signal line according to some embodiments.

Although the conductive traces illustrated in FIGS. 1 and 2 are located above a signal line, note that other arrangements may be provided. For example, FIG. 3 is a side view of a printed circuit board 300 wherein a conductive trace 320 is located below a signal line 310 according to some embodiments (e.g., the conductive trace may be provided on a lower layer). A dielectric layer 330 may be provided between the signal line 310 and the conductive trace 320 to facilitate electromagnetic coupling between them.

Figure 4:
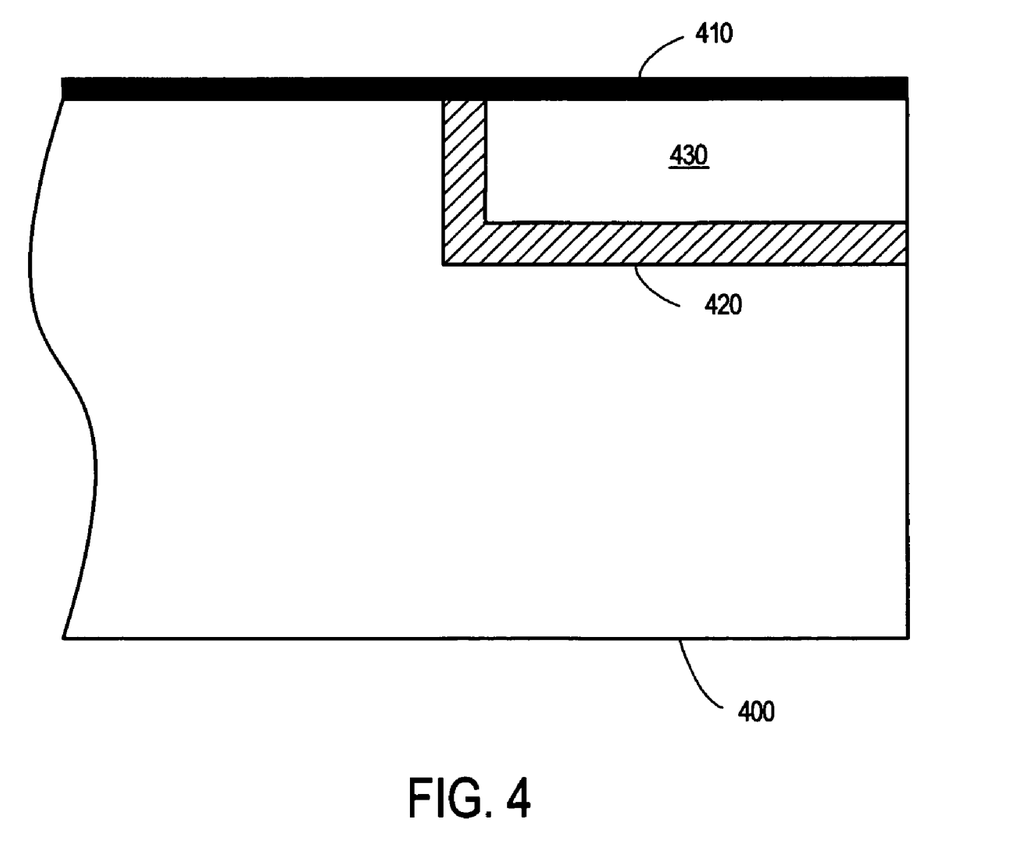
FIG. 4 is a side view of a printed circuit board having a microstrip signal line according to some embodiments.

Similarly, although the signal lines illustrated in FIGS. 1 through 3 are offset strip lines, other arrangements may be provided. For example, FIG. 4 is a side view of a printed circuit board 400 having a microstrip signal line 410 according to some embodiments. The microstrip signal line 410 may be provided on the surface of the printed circuit board 400 and at least a portion of a conductive trace 420 may be embedded in the printed circuit board 400 under the signal line 410 (and a dielectric area 430 might be provided between them).

The strength of the electromagnetic coupling between a signal line and a conductive trace may depend in part on the distance between them. As a result, a relatively small error in a horizontal offset between them (e.g., due to manufacturing tolerances and/or registration errors between the layer of the signal line and the layer of the conductive trace) may cause a substantial change in the electromagnetic coupling. To reduce this effect, according to some embodiments, a first portion of a conductive trace might also be horizontally offset from a signal line in a first direction (within the horizontal plane of the conductive trace) while a second portion of the conductive trace is horizontally offset from the signal line in a second direction within that plane, the second direction being opposite the first direction.

Figure 5:
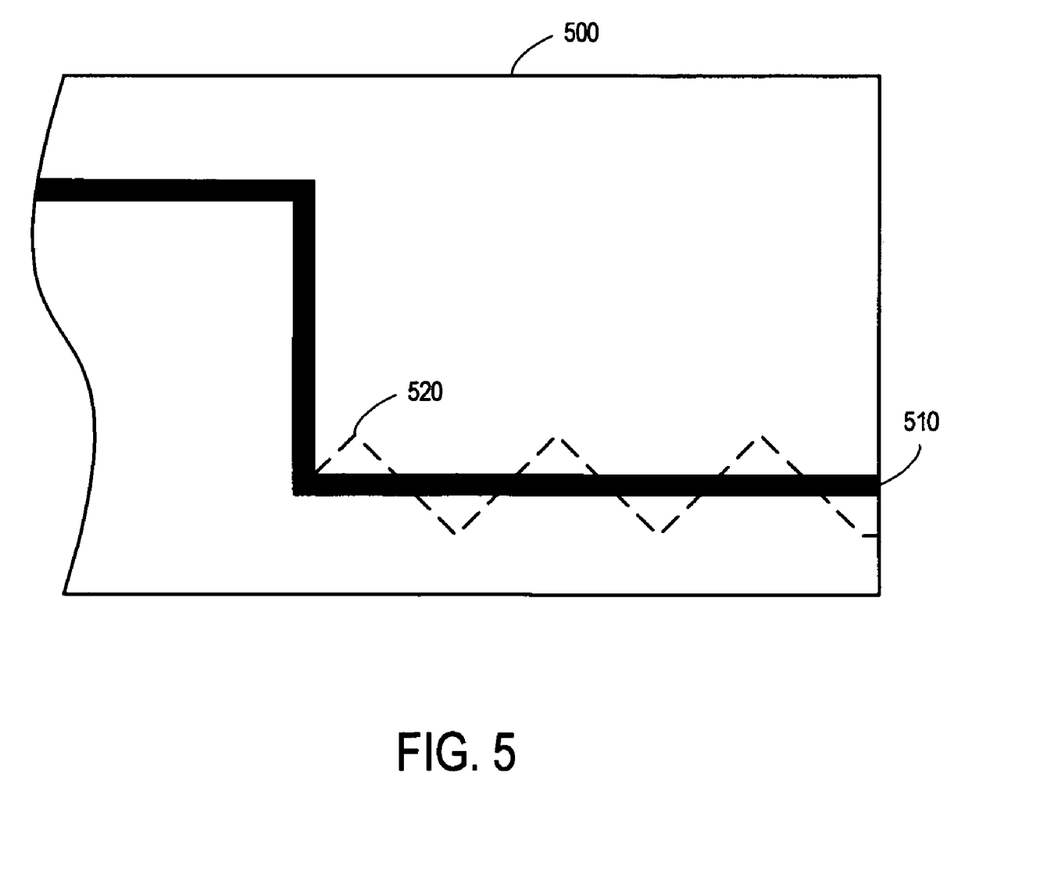
FIG. 5 is a top view of a printed circuit board wherein a conductive trace follows a zig-zag pattern according to some embodiments.

For example, FIG. 5 is a top view of a printed circuit board 500 having a signal line 510 and a conductive trace 520 that follows a zig-zag pattern within the layer of the conductive trace 520 according to some embodiments. Note that the coupling between the signal line 510 and the conductive trace 520 may occur primarily at the areas where they pass over (or under) each other. Also note that with the zig-zag pattern, an offset error between the layer of the signal line 510 and the layer of the conductive trace 520 (e.g., the conductive trace 520 is moved up or down in FIG. 5) might not substantially change the size of these areas. As a result, a more stable HREM probe may be provided. According to other embodiments, the signal line 510 may follow a zig-zag pattern within its layer instead of, or in addition to, the conductive trace 520. According to still other embodiments, the conductive trace 520 may follow a curved pattern, such as a sinusoidal pattern. Note that dielectric portions (not illustrated in FIG. 5) might be provided in some or all of the areas between the signal line 510 and the conductive trace 520.

Figure 6:
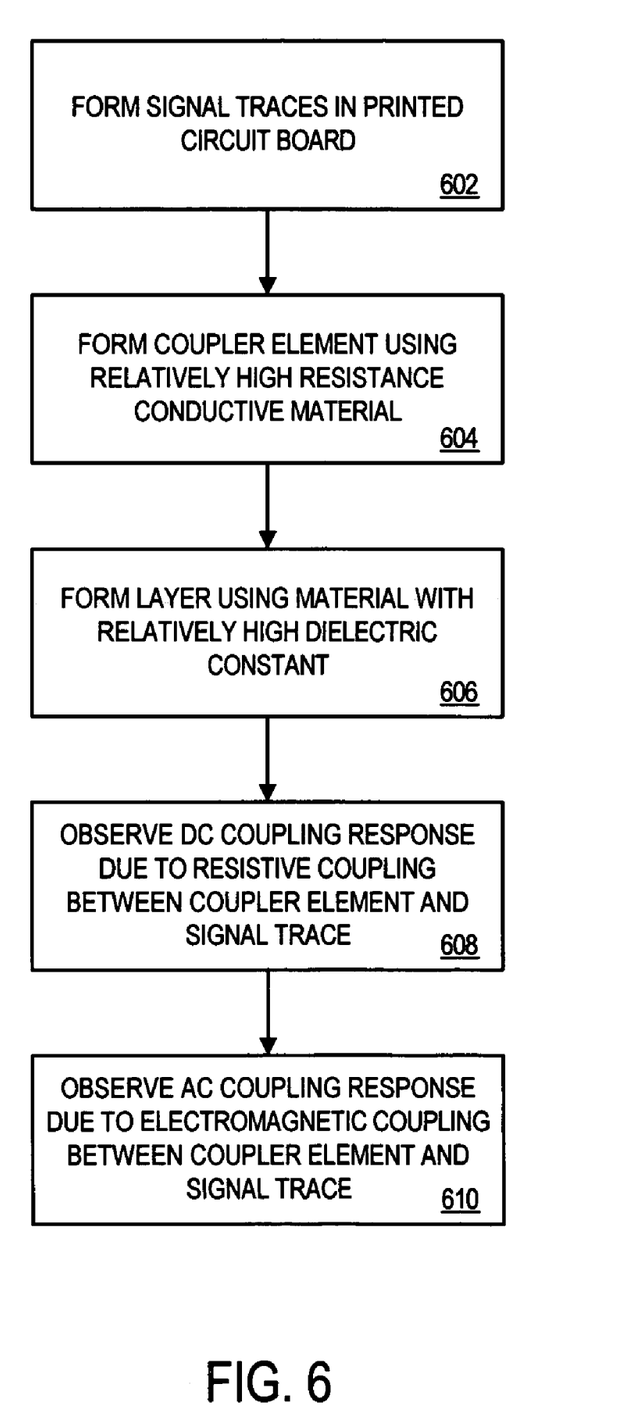
FIG. 6 is a flow chart of a method according to some embodiments.

FIG. 6 is a flow diagram illustrating a method according to some embodiments. The method may be performed, for example, by a system designer, a circuit board manufacturer, and/or a tester. The flow chart described herein does not necessarily imply a fixed order to the actions, and embodiments may be performed in any order that is practicable.

At 602, signal traces are formed in a printed circuit board. For example, a first signal trace might be formed in a first layer of a printed circuit board, and a second signal trace might be formed in a second layer of the printed circuit board. The first signal trace may then be coupled to the second signal trace through a via between the first and second layers.

At 604, a coupler element is formed using a relatively high resistance conductive material. Moreover, a portion of the coupler element is electrically connected to the second signal trace at the via and a second portion of the coupler element is offset from the second signal trace. A layer is then formed at 606 between the second signal trace and the coupler element using a material with a relatively high dielectric constant.

Note that the materials and geometries of the second signal trace, the coupler element, and/or the dielectric layer may determine the AC and DC coupling response. According to some embodiments, some or all of these may be selected by a system designer to improve performance. For example, the high frequency response (AC coupling) might be determined in part on the distance between second signal trace and the coupler element, the length of the coupler element, the dielectric constant of the dielectric layer, the thickness of the dielectric layer, and/or properties of the surrounding media (e.g., increasing the dielectric constant of the dielectric layer may allow for a shorter coupler element). Similarly, the low frequency response (DC coupling) may be determined in part by the length, width, and resistivity of the coupler element.

Figure 7:
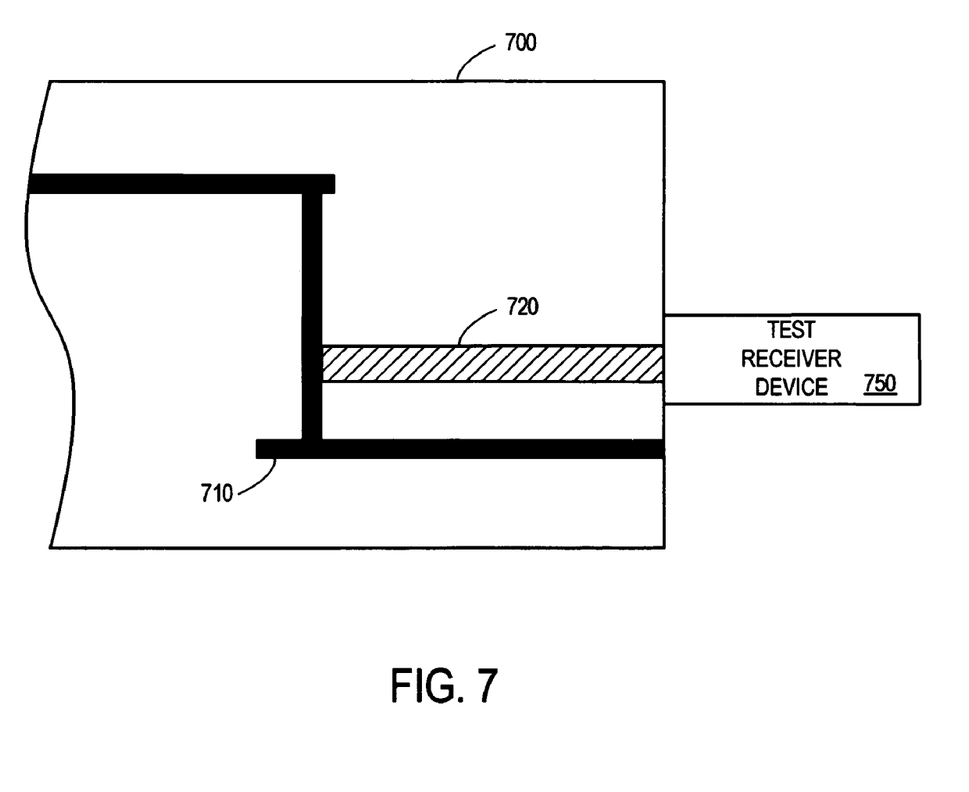
FIG. 7 illustrates a printed circuit board attached to a test receiver device according to some embodiments.

At 608, a DC coupling response due to resistive coupling between the coupler element and the second signal trace is observed. Similarly, an AC coupling response due to electromagnetic coupling between the coupler element and the second signal trace is observed at 610. For example, FIG. 7 illustrates a printed circuit board 700 attached to a test receiver device 750 according to some embodiments. Note that the voltage response at the test receiver device 750 may be associated with a superposition of a DC coupling response due to resistive coupling and an AC coupling response due to electromagnetic coupling between a signal trace 710 and a coupler element 720.

Figure 8:
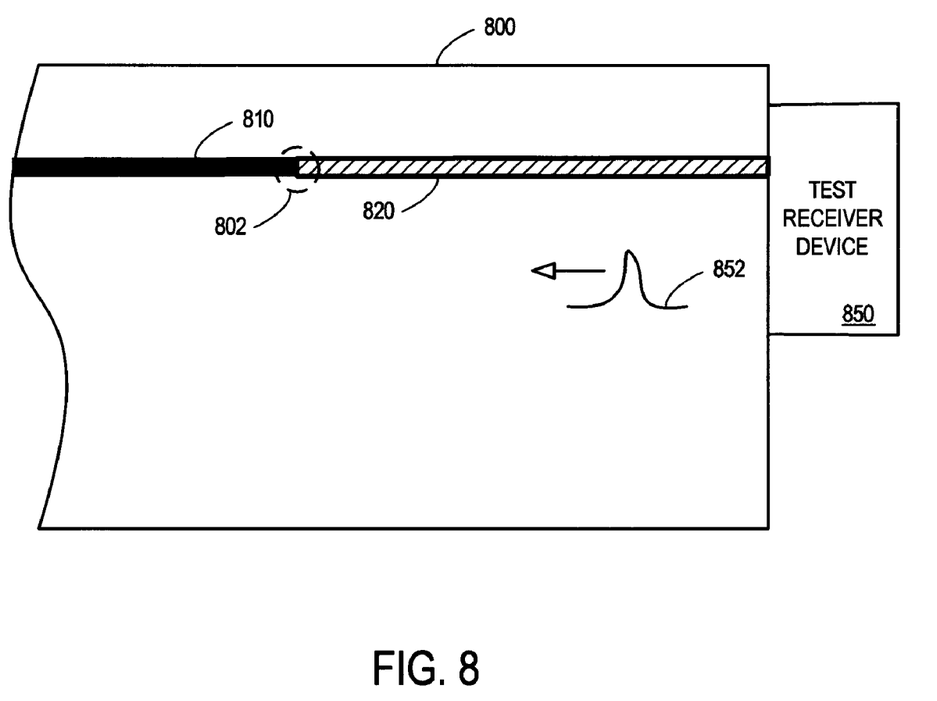
FIG. 8 is a top view of a printed circuit board according to some embodiments.

Also note that the presence of the test receiver device 750 may cause a signal reflection. For example, FIG. 8 is a top view of a printed circuit board 800 including a signal line 810 connected to a conductive trace 820 at a via 802 according to some embodiments. In this example, the conductive trace 820 is located above the signal line 810. The presence of a test receiver device 850 may cause energy 852 to be reflected and to propagate away from the test receiver device (e.g., toward a via).

Figure 9:
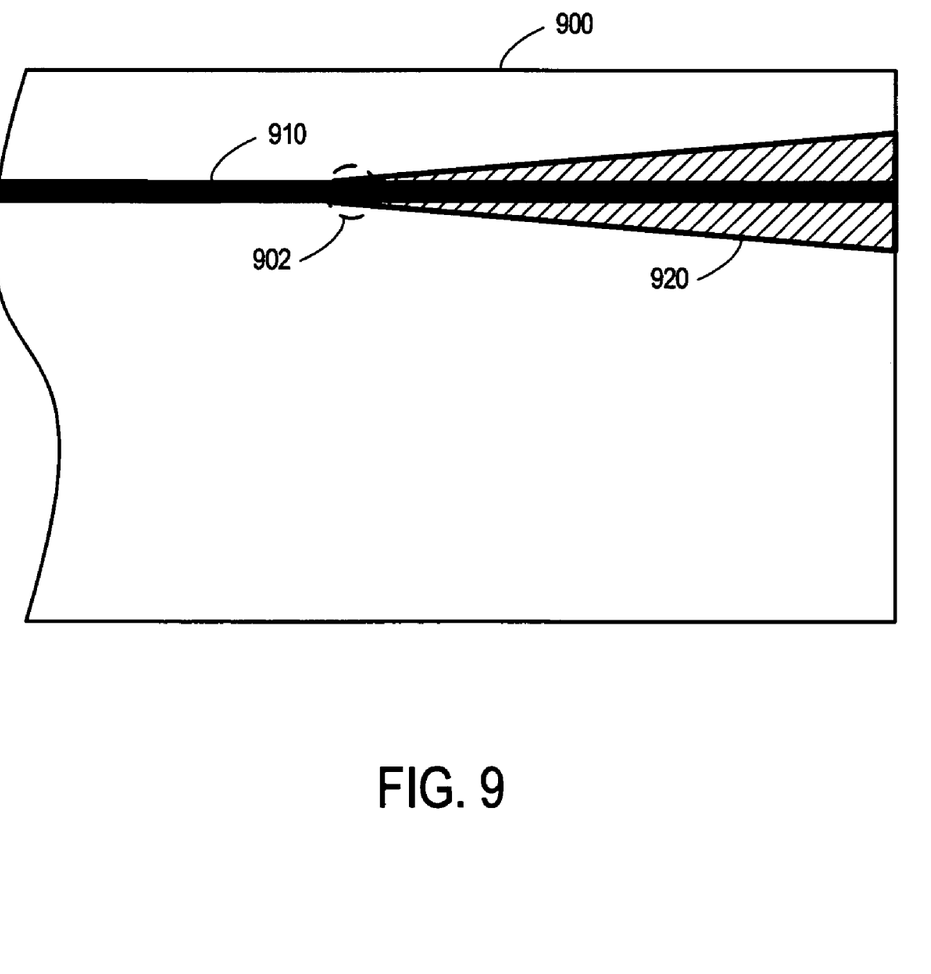
FIG. 9 is a top view of a printed circuit board having a tapered conductive trace according to some embodiments.

To reduce this effect, the resistance of a conductive trace might be varied. For example, some portions of the conductive trace might be wider than other portions (and thus provide less resistance). FIG. 9 is a top view of a printed circuit board 900 having a tapered conductive trace 920 connected to a signal line 910 at a via 902 according to some embodiments. In this example, the conductive trace 920 is located below the signal line 910. Moreover, the conductive trace 920 becomes more narrow near the portion of the conductive trace that is electrically connected to the signal line 910 (e.g., at the via 902).

By varying the resistivity of the conductive trace 920 per unit length, the reflection coefficient associated with the design may be improved. According to some embodiments, the width of the conductive trace 920 may follow a linear or trigonometric relationship with the distance from a via or an end of the conductive trace 920. According to some embodiments, the edge of the conductive trace 920 may be curved, and/or a portion of the conductive trace 920 may have a constant width.

By way of example only, length of the conductive trace 920 might be approximately 25 mils long, and the signal trace 910 might have width of approximately 4 mils. Moreover, the width of the conductive trace might vary from approximately 3 mils to approximately 9 mils. In addition, a dielectric layer (not illustrated in FIG. 9) might have a thickness of approximately 1.58 mils and be formed of material having a dielectric constant of approximately 20. According to some embodiments, upper and lower ground planes may be provided, and upper and lower printed circuit board layers might have thicknesses of approximately 6 mils.

Figure 10:
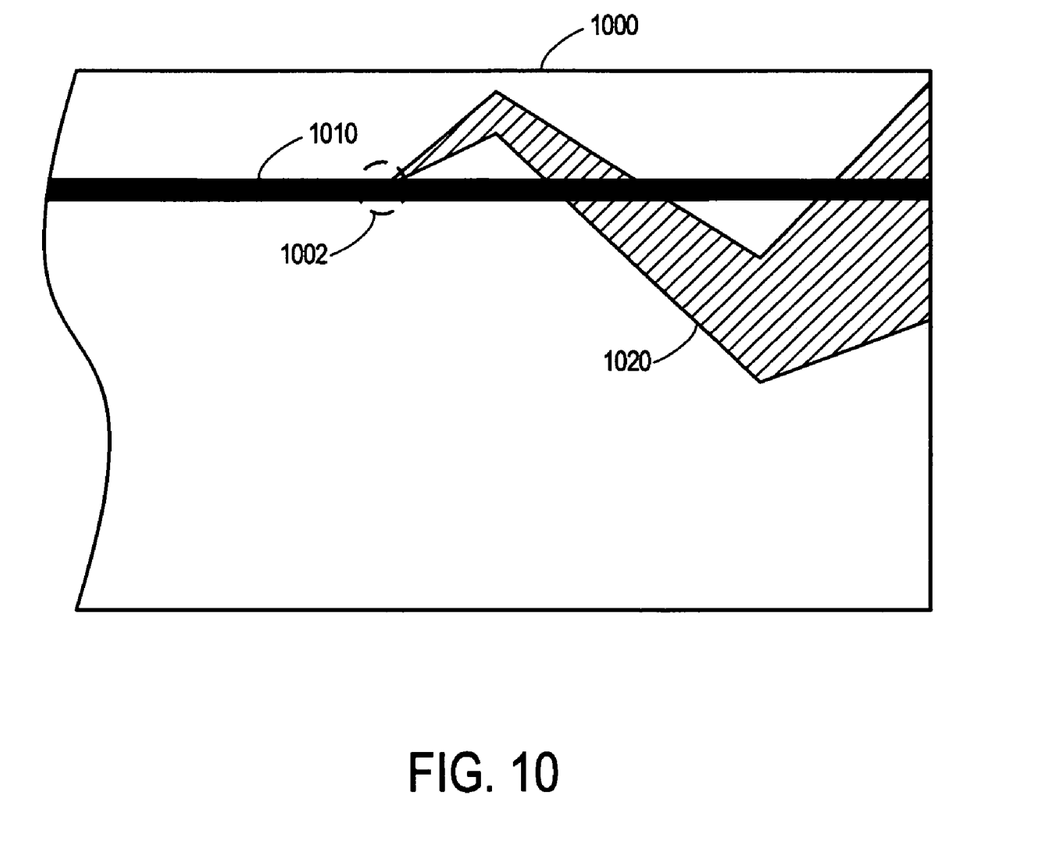
FIG. 10 is a top view of a printed circuit board having a tapered conductive trace that follows a zig-zag pattern according to some embodiments.

Note that providing a tapered conductive trace 920 could also reduce any effects caused when the conductive trace 920 is formed misaligned with the signal trace 910 (e.g., due to manufacturing tolerances). To further reduce such effects, FIG. 10 is a top view of a printed circuit board 1000 having a tapered conductive trace 1020 that follows a zig-zag pattern within its layer according to some embodiments (e.g., following a pattern similar to that described with respect to FIG. 5) and is connected to a signal line 1010 at a via 1002. That is, some portions of the conductive trace 1020 are positioned to one side of the signal line 1010 while other portions are positioned to the other side the signal line 1010.

Figure 11:
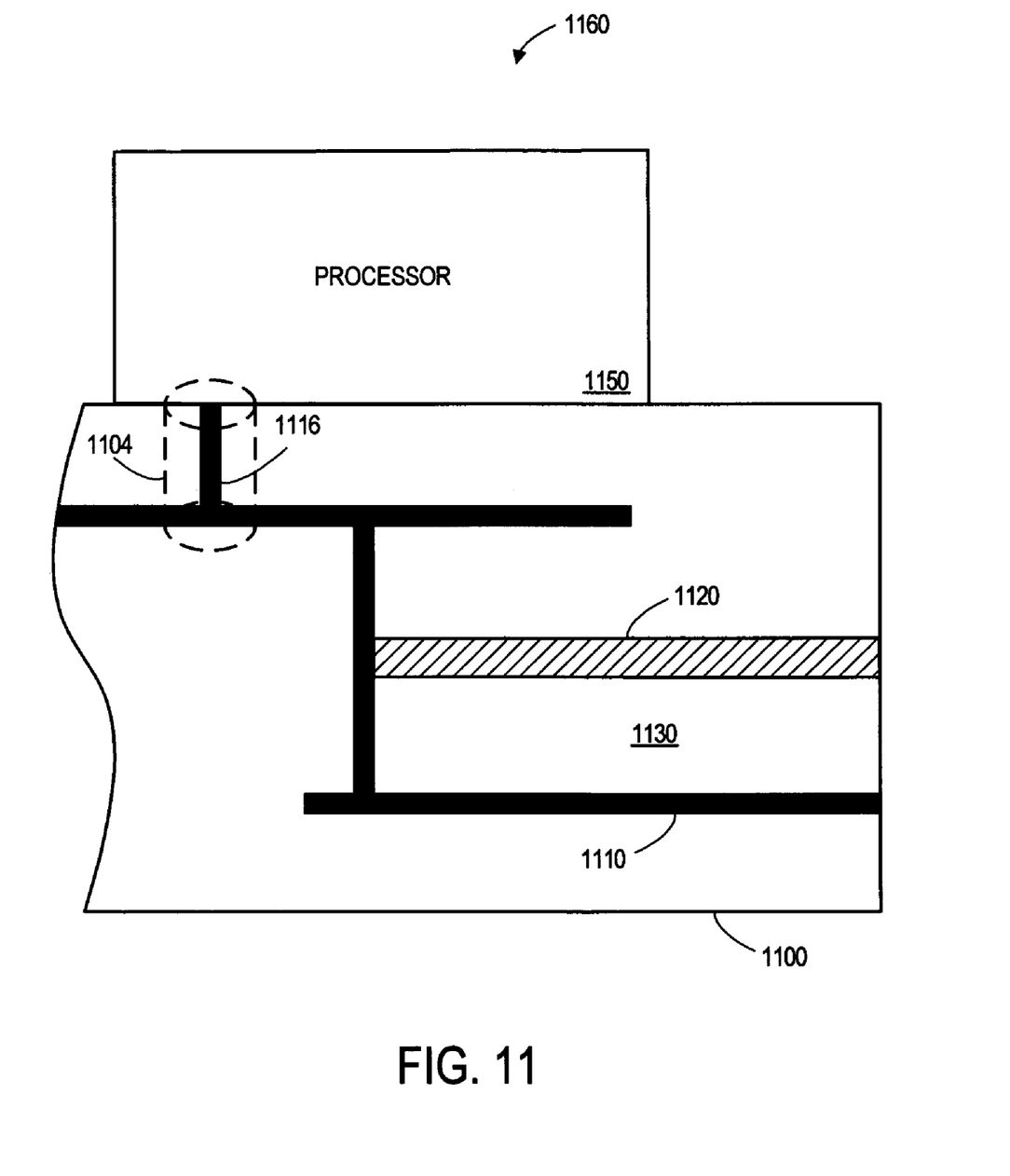
FIG. 11 is a block diagram of a system according to some embodiments.

FIG. 11 is a block diagram of a system 1160 according to some embodiments. The system includes a substrate 1100 having a relatively high-speed data line 1110 in multiple layers. A resistive probe 1120 is electrically coupled to a portion of the data line 1110, and at least a portion of the resistive probe 1120 is offset from the data line 1110. A dielectric layer 1130 may be formed between the data line 1110 and the resistive probe 1120.

A processor 1150 may also be electrically coupled to the data line 1150. For example, the processor 1150 may be coupled to the data line 1110 through plating 1116 provided in a via 1104 of the substrate 1100. The processor 1150 may then exchange signals through the data line 1110 (e.g., with a memory unit or IO device). Moreover, the resistive probe 1120 may be used to observe the signals according to any of the embodiments described herein.

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, although particular conductive trace designs have been described herein, other designs may be used in connection with any of the embodiments. Similarly, although particular materials have been described as example, other materials may be used.

Figure 12:
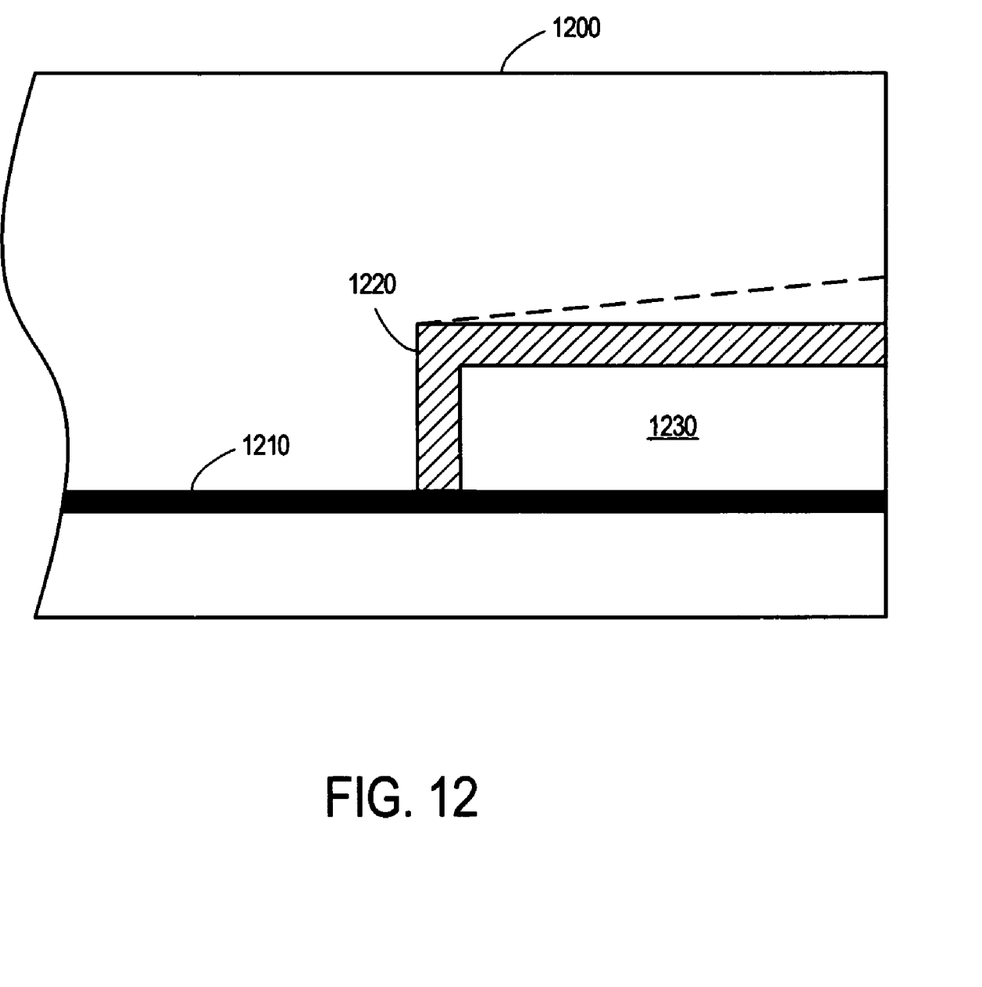
FIG. 12 is a top view of a printed circuit board according to another embodiment.

In some embodiments described here, the offset between a signal line and a conductive trace is achieved by placing them on different layers. Note, however, that an offset may be provided when the signal line and the conductive trace are located in the same layer. For example, FIG. 12 is a top view of a printed circuit board 1200 wherein a signal line 1210 is formed in the same layer as a conductive trace 1220. Moreover, a dielectric area 1230 may also be provided in that layer and/or in neighboring layers. Note that width of the conductive trace 1220 could vary as described with respect to FIG. 9 (e.g., the conductive trace width might expand as indicated by the dashed line in FIG. 12).

Moreover, although HREM probes have been described with respect to single signal lines, note that such probes may also be provided for differential signal lines. In this case, a first HREM probe might be connected to the signal+ line and a second HREM probe may be connected to the signal- line.

The several embodiments described herein are solely for the purpose of illustration. Persons skilled in the art will recognize from this description other embodiments may be practiced with modifications and alterations limited only by the claims.

What is claimed is:

1. A system, comprising:
   a substrate, including:
      a relatively high-speed data line,
      a resistive probe electrically connected to a portion of the data line, wherein at least a portion of the resistive probe is offset from the data line to provide electromagnetic coupling, and
      a dielectric layer between the data line and the resistive probe; and
   a processor electrically connected to the data line.

2. The system of claim 1, wherein a width of the resistive probe vanes.

3. The system of claim 1, wherein the resistive probe forms a zig-zag pattern.

4. An apparatus, comprising:
   a signal line associated with a printed circuit board;
   a conductive trace electrically connected to a portion of the signal line, wherein at least a portion of the conductive trace is offset from the signal line; and
   a dielectric layer between the signal line and the conductive trace, wherein the conductive trace comprises a relatively high resistance conductive material.

5. An apparatus, comprising:
   a signal line associated with a printed circuit board;
   a conductive trace electrically connected to a portion of the signal line, wherein at least a portion of the conductive trace is offset from the signal line; and
   a dielectric layer between the signal line and the conductive trace, wherein the signal line is a first signal line on a first layer of the printed circuit board, and further comprising:
   a second signal line on a second layer of the printed circuit board, the first and second signal lines being electrically coupled through a via, wherein the conductive trace is electrically connected to the first signal line at the via.

6. An apparatus, comprising:
   a signal line associated with a printed circuit board;
   a conductive trace electrically connected to a portion of the signal line, wherein at least a portion of the conductive trace is offset from the signal line; and
   a dielectric layer between the signal line and the conductive trace, wherein the conductive trace comprises a relatively thin film resistive element.

7. An apparatus, comprising:
   a signal line associated with a printed circuit board;
   a conductive trace electrically connected to a portion of the signal line, wherein at least a portion of the conductive trace is offset from the signal line; and
   a dielectric layer between the signal line and the conductive trace, wherein a width of the conductive trace varies.

8. The apparatus of claim 7, wherein the conductive trace further comprises a zig-zag pattern within the layer of the conductive trace.

9. The apparatus of claim 7, wherein the signal line comprises a copper bus data line and the conductive trace comprises a resistive probe element.

10. The apparatus of claim 7, wherein the conductive trace is tapered, becoming more narrow near the portion of the conductive trace that is electrically connected to the signal line.

* * * * *